(12) United States Patent
Suleski et al.

(10) Patent No.: US 6,638,667 B2
(45) Date of Patent: *Oct. 28, 2003

(54) FABRICATING OPTICAL ELEMENTS USING A PHOTORESIST FORMED USING OF A GRAY LEVEL MASK

(75) Inventors: Thomas J. Suleski, Charlotte, NC (US); William F. Delaney, Charlotte, NC (US); Michael R. Feldman, Charlotte, NC (US)

(73) Assignee: Digital Optics Corp., Charlotte, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/158,941

(22) Filed: Jun. 3, 2002

(65) Prior Publication Data

US 2002/0146627 A1 Oct. 10, 2002

Related U.S. Application Data

(63) Continuation of application No. 09/584,095, filed on May 31, 2000, now Pat. No. 6,420,073, which is a continuation-in-part of application No. 09/044,864, filed on Mar. 20, 1998, now Pat. No. 6,071,652.
(60) Provisional application No. 60/041,042, filed on Mar. 21, 1997.

(51) Int. Cl.[7] ............................. G03F 9/00; G03C 5/00
(52) U.S. Cl. ............................................. 430/5; 430/321
(58) Field of Search ......................... 430/5, 321, 322, 430/324, 296; 501/56; 359/19

(56) References Cited

U.S. PATENT DOCUMENTS

| 4,567,103 A | 1/1986 | Wu | 428/410 |
| 4,670,366 A | 6/1987 | Wu | 430/13 |
| 4,764,432 A | 8/1988 | Kalbitzer | 428/446 |

(List continued on next page.)

FOREIGN PATENT DOCUMENTS

| DE | 195 02 624 A1 | 1/1995 |

OTHER PUBLICATIONS

W.W. Anderson et al. "Fabrication of Micro–Optical Devices", Confirmation on Binary Optics, 1993, pp. 255–269.

Donald C. O'Shea et al. "Gray–Scale Masks for Diffractive Optics Fabrication": II. Spatially Filtered Halftone Acreens, Applied Optics/ vol. 34, No. 32/Nov. 10, 1995, pp. 7518–7526.

(List continued on next page.)

Primary Examiner—S. Rosasco
(74) Attorney, Agent, or Firm—Susan S. Morse

(57) ABSTRACT

Gray scale masks used to create optical elements are formed. Desired gray scale patterns may be created by varying a transmission across a mask, e.g., by varying the thickness of a light absorbing layer. Such variations in thickness may be created using multiple binary masks. Desired gray scale patterns may also be created on a computer using available software and then imaged onto film or a glass film plate. Direct contact or proximity printing is then used to transfer the true gray scale pattern onto a photoresist layer. The photoresist layer is then etched, thereby forming the desired pattern therein. All portions of the desired pattern are simultaneously formed in the photoresist layer. The etched photoresist layer is then used to photolithographically fabricate either the optical element itself or a master element to be used in injection molding or other replication techniques. The gray scale mask itself may be used repeatedly to generate photoresist layers.

10 Claims, 3 Drawing Sheets

U.S. PATENT DOCUMENTS

| | | | | |
|---|---|---|---|---|
| 4,894,303 A | | 1/1990 | Wu | 430/13 |
| 5,078,771 A | | 1/1992 | Wu | 430/13 |
| 5,145,757 A | | 9/1992 | Smoot et al. | 430/5 |
| 5,213,916 A | | 5/1993 | Cronin et al. | 430/5 |
| 5,480,764 A | | 1/1996 | Gal et al. | 430/321 |
| 5,482,800 A | | 1/1996 | Gal | 430/5 |
| 5,718,991 A | | 2/1998 | Lin et al. | |
| 5,725,975 A | | 3/1998 | Nakamura et al. | 430/5 |
| 5,830,605 A | | 11/1998 | Umeki et al. | 430/5 |
| 6,107,000 A | * | 8/2000 | Lee et al. | 430/296 |

OTHER PUBLICATIONS

Gregary Sharp, MEMS Optical Inc. "Gray Scale Methods Produce High Efficiency Diffractive Optics"; Photonics Online. Com., Feb. 24, 1998.

Thomas J. Suleski et al., "Gray–Scale Masks for Diffractive–Optics Fabrication: I. Commercial Slide Imagers", Nov. 10, 1995/ vol. 34, No. 32/ Applied Optics, pp. 7507–7517.

Osamu Woda, "Ion–Beam Etching of INP and its Application to the Fabrication of High Radiance INGAASP/INP Light Emitting Diodes", J. Electrochem. Soc.: Solid–State Science and Technology, Oct. 1984, pp. 2373–2380.

* cited by examiner

FABRICATING OPTICAL ELEMENTS USING A PHOTORESIST FORMED USING OF A GRAY LEVEL MASK

CROSS-REFERENCE TO RELATED APPLICATIONS

This application is a continuation of Ser. No. 09/584,095 May 31, 2000 U.S. Pat. No. 6,420,073, which is a continuation-in-part of U.S.C. §120 to to U.S. application Ser. No. 09/044,864 filed Mar. 20, 1998, now U.S. Pat. No. 6,071,652, which claims priority under 35 U.S.C. §119(e) to U.S. Provisional Application Ser. No. 60/041,042 filed Mar. 21, 1997, all of which are incorporated by reference in their entirety for all purposes.

BACKGROUND OF THE INVENTION

1. Field of the Invention

The present invention is directed to making optical elements, particularly refractive elements, using gray level or scale masks. More particularly, the present invention is directed to making gray level masks with a high resolution and which can be used for fabricating multiple arrays of refractive elements simultaneously. The present invention is also directed to transferring patterns of gray level masks onto a photoresist using contact or proximity printing. The photoresist is then used to make the desired optical element. The gray level masks can be used repeatedly for making optical elements.

2. Description of Related Art

One conventional technique for forming a refractive element includes forming a structure in photoresist by patterning and melting a photoresist layer on a glass substrate. This melting of the photoresist generates spherical surfaces. Such a technique is disclosed, for example, in an article by O. Wada, "Ion-Beam Etching of InP and it's Application to the Fabrication of High Radiance InGAsP/InP Light Emitting Diodes", General Electric Chemical Society, Solid State Science and Technology, Vol. 131, No. 10, October, 1984, pp. 2373–2380.

However, this technique is limited to special shapes and can only provide spherical contours using a small positive photoresist layer. Further, the refractive elements are produced by ion milling the resist structure and the glass substrate. The ions first mill the resist. Once the resist is removed in a certain region, the ions mill the glass substrate. In this manner, the resist structure is transferred to the glass substrate, thereby forming the refractive element.

A varied exposure pattern in a photoresist can also be generated by directly exposing the photoresist with a raster-scanned laser or electron beam. However, in this case, no mask is created. Each element must be written one at a time, with no benefit of economies of scale. It is desirable to create a gray scale mask that can be reused multiple, for example, thousands, of times to make thousands of wafers.

In attempting to overcome these limitations, an exposure mask for fabricating microlenses was developed and disclosed, for example, in U.S. Pat. No. 5,480,764 and 5,482,800 to Gal et al. and in an article by W. W. Anderson et al. "Fabrication of Microoptical Devices" Conference on Binary Optics, 1993, pp. 255–269. According to this technique, known as half-toning, the mask is created by constructing a plurality of precisely located and sized openings, the frequency and size of these openings producing the desired gray scale effect.

In this technique, each pixel is divided into sub-pixels and each sub-pixel is sub-divided into gray scale resolution elements. The smallest features of this mask, i.e., the gray scale resolution elements, are binary. These gray scale resolution elements are either open or closed, i.e., on or off. The size of a mask opening for that sub-pixel is selected using sub-pixel location information and height or thickness information for that location. The size of the mask opening in each sub-pixel provides a gray scale resolution depending upon the number of resolution elements incorporated with that mask opening.

However, in using such a mask, in addition to the strict fabrication requirements, the mask is used with a stepper, i.e., the pattern of the mask is effectively reduced in size when exposing the resist layer. This reduction is required, since the gray scale resolution elements are binary, they must be blurred in order to present the desired gray scale effect so that the gray scale resolution elements no longer appear to be distinct holes. This leads to the mask having to be a number of times larger than the actual element. Thus, for simultaneously producing many elements, the mask will soon become impracticably large. Additionally, steppers are very expensive equipment.

Further, due to the required reduction, the point-spread function is larger than the image of the smallest opening in the mask. This blurring allows the mask to form a gray level pattern in the photoresist, but the large size of the point spread function results in a decreased resolution. As a larger number of gray levels are required, the larger the point spread function required, i.e., the more blurring required. Thus, this technique becomes impractical for a large number of gray levels.

SUMMARY OF THE INVENTION

Therefore, it is an object of the present invention to provide a mask for fabrication that is not structurally limited and does not need blurring of the image. It is further an object of the present invention to be able to create a mask that can be used repeatedly to make a large number of optics.

These and other objects of the present invention may be realized by providing a mask having a layer of varying transmissions, e.g., an absorption layer, made of, for example, amorphous silicon or metal, in which absorption varies with thickness. The pattern of the true gray scale mask may be transferred to a photoresist using contact or proximity printing. The photoresist is then used to transfer the pattern to create a desired optical element.

These and other objects may be realized by a method for making an optical element including generating a desired gray scale pattern on a mask to form a true gray scale mask by creating a layer having transmission varying across the mask in accordance with the desired gray scale pattern, positioning the true gray scale mask between a light source and a photoresist layer, exposing the photoresist layer to light from the light source through the mask to form a pattern therein, and transferring the pattern in the photoresist into a a transparent material to form an optical element. The creating may include placing a partially absorbing material on a transmissive substrate and patterning and etching the material with multiple binary masks. The creating may further include removing any sidewalls present in the refractive optical element. This removal may be performed by chemical etching the refractive optical element by heating the photoresist, prior to the transferring, to eliminate any sidewalls therein.

The transferring may include directly exposing the resist with laser beam or electron beam lithography. The patterning and etching step may include placing photoresist on the transmissive substrate, directly exposing the photoresist with one of a laser beam and electron-beam lithography, thereby creating a gray scale pattern in the resist, and transferring the gray scale pattern to the partially absorbing material.

These and other objects may further be realized by a method for making an optical element including placing a mask having a layer of mask material having a variable amplitude transmission in accordance with a desired continuous level phase transmittance function in direct contact with or in proximity of a photoresist on a substrate, exposing the photoresist through the mask, thereby forming the optical element in the photoresist, and transferring the pattern in the photoresist into a desired substrate, thereby forming the optical element. The transferring step may include placing the photoresist on the desired substrate and etching the photoresist into the substrate. Alternatively, the transferring step may include generating a master element from the photoresist and injection molding the desired substrate with the master element.

The optical element may be a refractive element, a diffractive element, a filter, a polarizer, or an anti-reflective structure.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in this art from this detailed description.

BRIEF DESCRIPTION OF THE DRAWINGS

The present invention will become more fully understood from the detailed description given hereinbelow in the accompanying drawings which are given by way of illustration only and thus are not limited to the present invention:

FIG. 1b illustrates the gray level mask created from the structure in FIG. 1a;

FIG. 2b illustrates a relief structure in quartz generated by reactive ion etching of the photoresist structure in FIG. 2a;

DETAILED DESCRIPTION OF THE PREFERRED EMBODIMENTS

The present invention is directed to efficiently fabricating optical elements, such as refractives, diffractives, or hybrids thereof, by transferring a desired gray scale mask into a photoresist by contact or proximity printing. In accordance with the present invention, true gray scale masks may be generated using low cost photolithographic techniques. The true gray scale masks used with contact or proximity printing may be generated in a variety of ways, some of which are discussed below.

Gray Level Masks in Absorptive Material

Figure 1A:
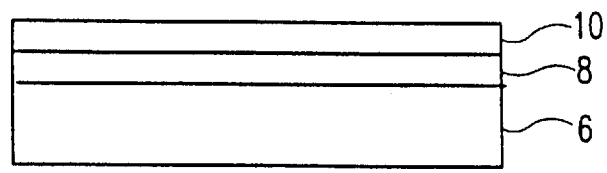
FIG. 1a illustrates a structure used for creating a gray level mask of a first embodiment.

FIG. 1a illustrates a structure that may be processed into a gray scale mask in accordance with the present invention. This structure includes a transparent substrate 6, a layer 8 of a material whose absorption of radiation, typically in the ultraviolet region, increases with the thickness thereof, such as metal or amorphous silica, and a photoresist layer 10. The terms transmissive and absorbing refer to the wavelength used during photoresist exposure using the mask, discussed in detail below.

A desired pattern is produced, in accordance with the present invention, in the photoresist layer 10 in accordance with techniques previously used for making diffractive optical elements in resist. Such techniques include creating a continuous diffractive optical element using direct writing with a laser or a multiple discrete level binary optics using plural binary masks. The pattern in the photoresist layer 10 is then transferred to the layer 8 of absorptive material. This can be achieved through ion-milling, reactive ion etching, chemical etching, or other techniques.

The gray scale mask of the present invention may be formed by patterning the photoresist layer 10 with a first mask, transferring this pattern into the absorptive material 8, depositing another photoresist layer, patterning this layer with a second mask, transferring this pattern into the absorptive material, until the desired number of levels is reached. Alternately, the gray scale mask of the present invention may be made using deposition lift off in which the photoresist is first deposited on the substrate 6, the photoresist layer 10 is then patterned with a first mask, the material layer 8 is then deposited on the patterned photoresist layer 10. The photoresist layer 10 is then dissolved, lifting off material layer 8 where the material layer is deposited over the photoresist, leaving the material in the other regions. Another photoresist layer is then added over the remaining material and patterned with a second mask. Another material layer is then deposited on the photoresist layer patterned with the second mask. This process is repeated until the desired number of levels is formed.

Figure 1B:
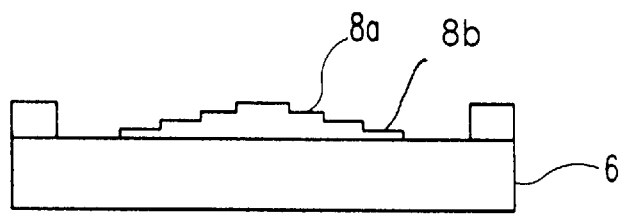

The resulting mask in the absorptive layer 8 is therefore controlling the amount of light passed therethrough in a single structure, thus presenting a true gray scale mask. As can be seen in FIG. 1b, the peripheral portions 8b will transfer some, though less, radiation than the central portion 8a. The relationship between the amount of radiation passing through the absorptive material and the thickness thereof determines the level of gray scale available.

Even when used with projecting or stepper techniques to form an element, this gray scale mask of absorptive material has a higher resolution than the previous stepper gray scale masks of varying small clear and opaque regions, since the gray level mask of FIG. 1b does not rely on blurring to achieve a gray scale. Further, by creating the gray scale mask using multiple binary masks in absorbing material allows better control of sidewall sharpness and actual depth.

It is noted that since the gray scale mask in accordance with the present invention is formed using an absorptive material and a difference in the absorption constitutes the different regions of the gray scale mask, the physical profile of the gray scale mask will not be identical to the profile of the element to be made using the gray scale mask. In particular, absorption in the absorptive material varies logarithmically, i.e., $e^{-\alpha d}$, where $\alpha$ is the absorption coefficient of the material and d is the depth or thickness of the material. Thus, the thinner the layer is, the less the depth needs to be altered in order to change the transmission. Therefore, to transfer a particular depth to a substrate, the transmission of a particular portion of the mask is the critical parameter of the mask.

When creating a gray scale mask in accordance with the present invention, it is advantageous to use the lithographic process set forth in U.S. Pat. No. 5,218,471 to Swanson et al. entitled "High-Efficiency, Multilevel, Diffractive Optical Elements", which is hereby incorporated by reference in its entirety. In accordance with this process, for N>1, each mask can provide more than one additional level. When the masks are binary masks, N masks may be used to create more than N+1 levels. The number of levels being used will determine the transmission required for each level. Once a lowest desired transmission, down to 0%, and a highest desired transmission, up to 100%, are determined, the range between these transmissions is divided between the number of levels, with the resulting delta being the difference in transmission between levels.

In accordance with this process, by designing binary masks to have their openings overlap, more than N+1 levels can be created. However, due to the nonlinear relationship between the absorption characteristic and the thickness of the material used in accordance with the present invention, these levels are not evenly spaced, i.e., the difference in thickness between the levels varies.

This process is particularly advantageous when using the gray scale mask of the present invention to create a refractive element or a diffractive element having a continuous surface, in which numerous, e.g., eight or more, levels are required to achieve the desired continuous surface. The more levels the gray scale mask has, the better the approximation to the continuous surface.

When creating such a gray scale mask with numerous levels, it is advantageous to use a material having transmittance that varies by a sufficient amount with a small change, e.g., a few hundred angstroms, in thickness. An example of such a material is incanel, which is a nickel alloy composed of approximately 72% nickel, 12% iron and 16% chromium. For incanel, a maximum thickness of approximately 1000 angstroms can accommodate a range from approximately 5% transmittance to approximately 100% transmittance. When using numerous levels, this allows the mask to remain thin. The transmission of incanel can be controlled to within approximately 1%.

The overall thickness of the mask is an important consideration to avoid diffraction effects through clear regions of the mask. The avoidance of these effects is important for both structures requiring sharp discontinuities as well as for structures created with numerous levels.

Creating Optical Elements with a True Gray Scale Mask

Once a satisfactory true gray scale mask has been formed, reproduction thereof in a photoresist layer may be achieved by positioning the mask between the photoresist layer and a radiation source for exposing the photoresist layer in accordance with the present invention. True gray scale masks do not rely on blurring for their gray scale properties.

Figure 1C:
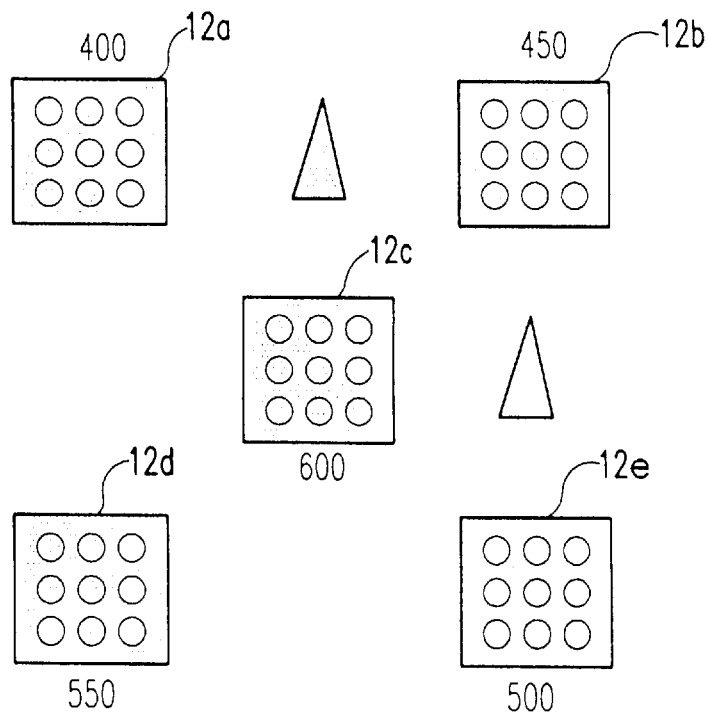
FIG. 1c illustrates another example of a gray scale mask.

In addition to the gray scale mask in absorptive material set forth above, there are other ways of making true gray scale masks. Gray scale masks generated based on desktop publishing techniques may use either photo reduced gray scale mask generated by a half-tone pattern or true gray scale printed masks. Such a mask, for example, is shown in FIG. 1c, as set forth, for example in Thomas J. Suleski and Donald C. O'Shea, "Gray-scale masks for diffractive-optics fabrication: I. Commercial slide imagers", Applied Optics, Vol.34, No.32, pp. 7507–17 (Nov. 10, 1995) and Donald C. O'Shea and Willie S. Rockward, "Grayscale masks for diffractive-optics fabrication: II. Spatially filtered halftone screens", Applied Optics, Vol. 34, No.32, pp. 7518–26 (Nov. 10, 1995), both of which are hereby incorporated by reference in their entirety. These masks may be transferred onto film or a glass film plate. Similarly, a mask containing a simulated grayscale consisting of variably sized clear and opaque regions and the stepper/projection method discussed in the background could be used to generate a true, smooth grayscale mask by transferring the reduced image onto film or a glass film plate, rather than using the image directly to make an element.

Further, in accordance with the present invention, an image of a gray level pattern created by either desk top publishing or half toning can be transferred to a light sensitive material, e.g., photoresist. This photoresist may then be used as a mask to form a true gray level mask in the absorptive material of the present invention. In accordance with this technique, a single mask formed in photoresist will generate more than two levels on the absorbing material. Of course, these masks for patterning the photoresist will have to be designed to account for the nonlinear relationship between the thickness and the transmission of the absorptive material. Thus, these masks would have a different design than those used for directly making the desired optical element.

Additionally, a true gray scale mask may be generated in high energy beam sensitive (HEBS) glass, in which the transmission is varied in accordance with exposure to a high energy beam, as set forth in U.S. Pat. No. 4,567,104 to Wu entitled "High Energy Beam Colored Glass Exhibiting Insensitivity to Actinic Radiation." Gray scale masks may also be provided patterning two layers, the material forming each layer having a transmission which is different from one another, as set forth in U.S. Pat. No. 5,213,916 to Cronin et al. entitled "Method of Making a Gray Level Mask."

The gray scale mask in FIG. 1c includes masks 12a–12e for forming five arrays of refractive elements. The numbers above these arrays represent, in microns, the center-to-center separation of the lenses in that array. The triangles shown in FIG. 1c are provided for indicating proper orientation to a user. The individual arrays 12a–12e each contains nine identical lenses in a three-by-three pattern. All the lenses formed by the gray mask 10 are designed to have the same focal lengths, but the diameters and center-to-center separation of the lenses are different for each array.

Figure 2A:
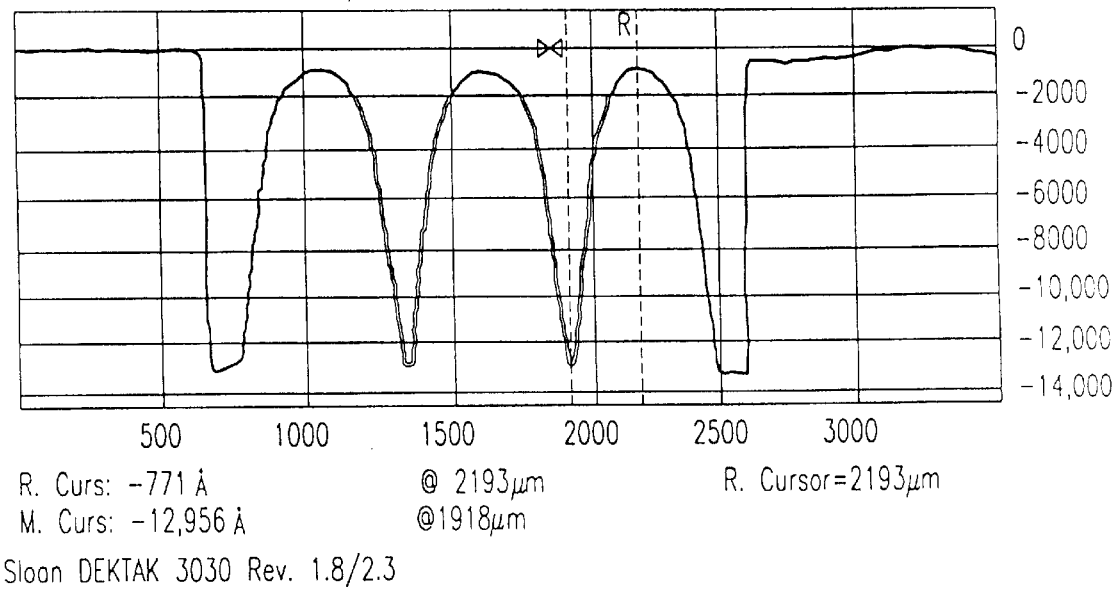
FIG. 2a illustrates a relief structure in photoresist using a photoreduced negative of the mask shown in FIG. 1c.
Figure 2B:
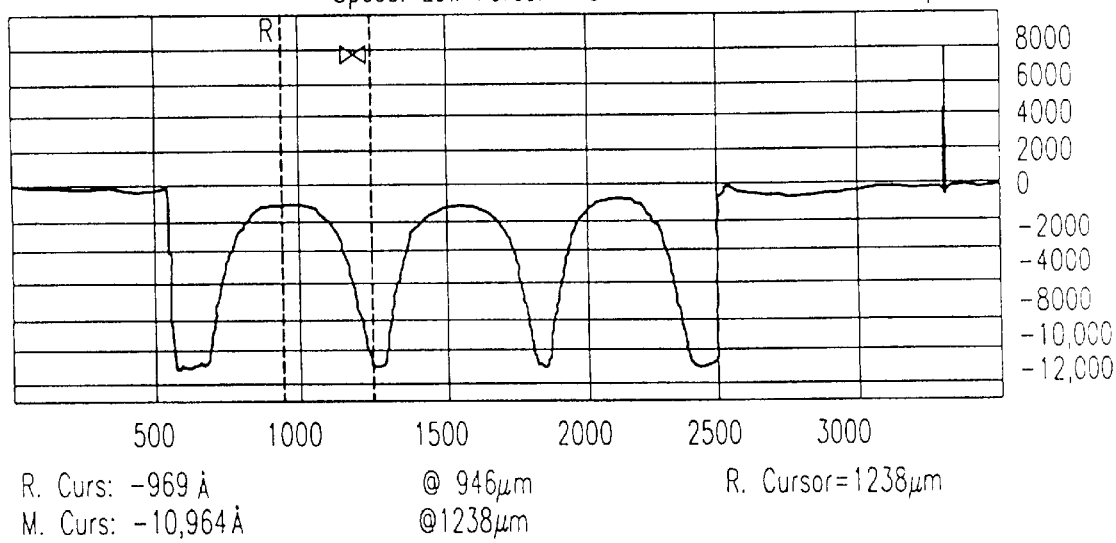

The gray scale masks shown in FIG. 1c are the negatives of the pattern actually used to fabricate the lenses. The lighter areas within the masks 12a–12e are the lenses, while the dark areas provide a vertical offset for the lenses. The resulting photoresist and optical element created from the mask 12c are shown in FIGS. 2a and 2b, respectively, as discussed below.

While any of the methods noted above to create a true gray scale mask could be used to create the masks shown in FIG. 1c, the gray scale masks actually shown in FIG. 1c were created using available software such as POST SCRIPT based applications, which require no special programming knowledge. Other available software for producing gray scale designs includes MATHEMATICA and FREEHAND. The design may then be output onto film, e.g., 35 mm slides or transparencies. The slides may be generated using available slide imagers, e.g., a Solitaire 8xp-slide imager. The 35-mm film is advantageously a high-resolution black and white film, e.g., Kodak Technical Pan Film. Alternatively, such a gray scale could be transferred onto a glass film plate, which is advantageous when performing contact printing.

Figure 3A:
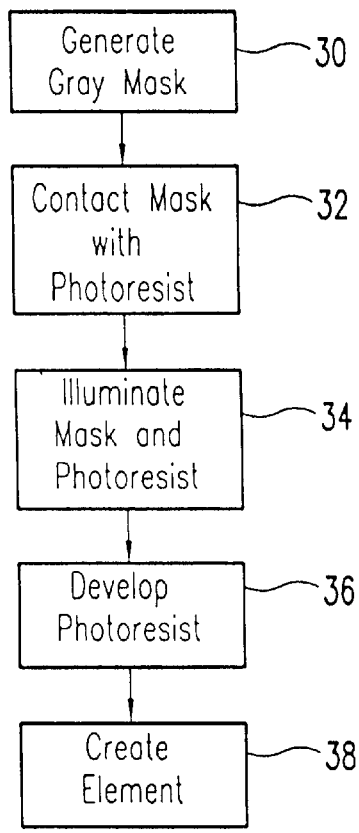
FIG. 3a is a flow chart of the formation of optical elements in accordance with the present invention.

The general description of how to create an element using a true gray scale mask is shown in the flow chart in FIG. 3a. A true grayscale mask is generated in one of the manners discussed above in step 30. The grayscale mask in positioned relative to the photoresist, for this method, in direct contact with a layer of light sensitive polymer, i.e., photoresist, on top of a substrate in step 32. The photoresist layer is then illuminated with an appropriate light source through the mask in step 34. More light is transmitted through the thinner areas than through the thicker areas. Steps 32 and 34 constitute the printing itself.

Figure 3B:
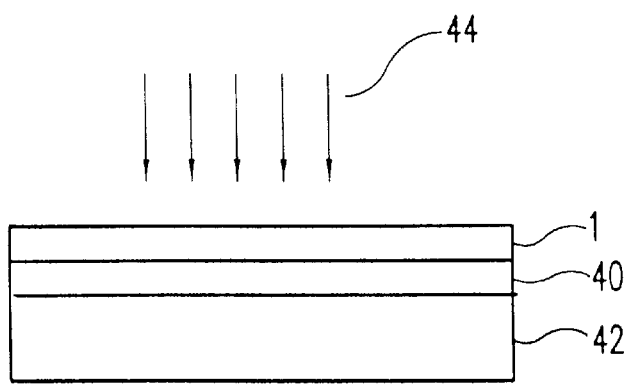
FIG. 3b is a schematic illustration of the contact printing of the present invention.

The positioning and illuminating of steps 32 and 34 are also schematically illustrated in FIG. 3b. In FIG. 3b, a true gray scale mask 1 is positioned between a photoresist layer a photoresist 40 on a substrate 42 and radiation used to expose the photoresist layer 40. In the particular example shown, the true gray scale mask 1 is in direct contact with the photoresist layer 40. The radiation 44 for the photoresist 40 impinges first upon the mask 1, thereby transferring the pattern from the mask 1 into the photoresist 40.

After exposure, the substrate and exposed photoresist are placed in a developing solution to be developed in a conventional manner in step 36. Assuming a positive photoresist, the areas where more light energy struck the photoresist are dissolved by the solution more quickly than the areas where little energy made it through the gray mask. Thus, light gray areas on the gray mask become low valleys in the photoresist, shown in FIG. 2a, while dark gray areas on the mask corresponding to the light areas in the relief structure that is created in the photoresist. If the photoresist is a negative photoresist, the roles of the light and dark gray areas are obviously reversed.

The resulting structure from the array mask 12c in FIG. 1c can be seen in FIG. 2a, which shows a profile of the photoresist formed by direct contact printing and etching from this mask. FIG. 2b shows a profile of the refractive lens array formed in quartz processed using the mask shown in FIG. 2a. The mask 12c was designed to provide a 600 micron center to center separation, a 575 micron diameter, and a sag or height in quartz of 1 micron. As can be seen from these relief structures in FIGS. 2a and 2b, the design parameters were accurately reproduced in the created photoresist and quartz elements.

As can be seen, the mask 12c provides a continuous surface profile to provide refractive lenses which are clearly separated. Further, the design of these refractive lenses is not limited to being spherical and symmetric. Asymmetric and/or aspherical lenses may be easily formed by choosing the proper design parameters when creating the gray scale masks themselves shown in FIG. 1b and 1c. An example of such a lens is shown in FIG. 4, in which a photoresist 42 of the desired lens is made on the substrate 40.

When forming a refractive element using a gray scale mask that does not itself have a continuous profile, such as the gray scale mask formed in accordance with the present invention, it may be desirable to reflow the photoresist before the final step 38 of forming the element. This reflow would involve only heating the photoresist up by a small amount such that any obvious discontinuities arising from the step wise nature of the gray scale mask will be eliminated. For example, a photoresist, e.g., Shipley 1075, would only have to be heated to 115°–125° C. Whether such a step is needed would depend on the sag of the refractive being made and the number of levels in the gray scale mask. Alternatively, after the photoresist has been transferred into the glass, the glass could be subjected to a process, such as a chemical etch for removing any sidewall structure resulting from the discrete gray scale mask.

In addition to the further processing steps noted above, sidewalls in the refractive elements formed using the discrete gray scale mask of the present invention may be eliminated by positioning the gray scale mask near, by not in contact with, the photoresist in step 32. This proximity positioning introduces an amount of defocus that will reduce the effect of the discrete steps on the pattern. The distance between the gray scale mask and the photoresist is typically 5–10 wavelengths of the light used to illuminate the mask in step 34, but this will depend on the number of layers, i.e., how closely the gray scale mask approximates a continuous surface. It is noted when using the true gray scale mask, this defocus is not used to simulate a gray scale, but only to eliminate the edges thereof. The true gray scale mask may also be used in conjunction with a stepper, allowing higher resolution than the previous stepper gray scale masks of varying small clear and opaque regions, since the true gray level mask of the present invention does not rely on blurring to achieve a gray scale.

Conclusion

Fabrication with these variable transmission masks reduces costs and eliminates alignment errors, since only one lithographic cycle is needed. Once a three dimensional relief structure has been created in the photoresist layer, different techniques may be used to create the desired elements in a number of ways.

The photoresist layer having the mask printed thereon may then be etched, preferably by reactive ion etching (RIE), to form the desired pattern therein. The mask may be used multiple, for example, thousands, of times to create structures in photoresists to be transferred to a desired material. Through the use of direct contact printing, these photoresist structures are easy and inexpensive to generate. The use of direct contact printing with a true gray scale mask results in shape and size flexibility for the desired optical element.

In addition, the photoresist structure can be used to create a master element for use in injection molding or other replication techniques. Preferably, a master element of quartz is etched using RIE to form a desired pattern thereon. Such injection molding using quartz is disclosed in commonly assigned, allowed co-pending application Ser. No. 08/381,169, which is hereby incorporated by reference in its entirety.

The direct contact printing and the proximity printing of the present invention has the advantages of higher resolution, and fewer limitations on entire element size than the stepper printing discussed in the background. Direct contact printing is particularly advantageous when used with true gray scale masks, i.e., no blurring required, such as a HEBS mask and the absorptive mask of the present invention. Proximity contact printing may be used with either true or simulated gray scale masks.

One advantageous application of this technique is the manufacture of an optical element containing a plurality of arrays. In accordance with the present invention, these arrays, and the elements therein, do not have to be the same. Further, by designing the gray scale masks in accordance with the present invention, easy reproduction, scale, alignment, etc. may be achieved. Such control allows more flexibility in design and variations in parameters to be tested.

Further, from the use of true gray scale masks, a lot more levels can be made, allowing creation of a precise profile, rather than a sharp edge. Thus, the present invention may be advantageously employed to create refractive elements.

Thus, the gray scale masks of the present invention may be simply and accurately produced. The particular absorptive material gray mask formed using techniques for creating diffractive or binary optics, allows the greater control of depth and steepness of the mask features. By direct contact or proximity printing true gray scale masks into photoresist, the photoresist structures may be simply and cheaply made, such that use of injection molding is not required for efficient manufacture of numerous optical elements. The gray level mask itself may be used again and again to create photoresists to be etched.

This invention being thus described, it will be obvious that the same may be varied in many ways. Such variations are not to be regarded as a departure of the spirit and scope of the invention, and all such modifications as would be obvious to one skilled in the art are intended to be included within the scope of the following claims.

What is claimed is:

1. A method for making an optical element comprising:

generating a desired gray scale pattern on a mask to form a true gray scale mask by creating a layer having transmission varying across the mask in accordance with the desired gray scale pattern;

positioning the true gray scale mask between a light source and a photoresist layer;

exposing the photoresist layer to light from the light source through the mask to form a pattern therein; and transferring the pattern in the photoresist into a transparent material to form a refractive optical element.

2. The method according to claim 1, wherein the layer having varying transmission is made of a material whose transmission varies with a thickness thereof.

3. The method according to claim 1, wherein said creating includes placing a partially absorbing material on a transmissive substrate and patterning and etching the material with multiple binary masks.

4. The method according to claim 1, further comprising removing any sidewalls present in the refractive optical element.

5. The method according to claim 1, further comprising, prior to said transferring, heating the photoresist layer to eliminate any sidewalls therein.

6. The method according to claim 1, wherein said transferring includes creating a master element from the photoresist layer and replicating the refractive optical element.

7. The method according to claim 1, wherein said transferring includes etching the pattern in the photoresist layer into the transparent material to form the refractive optical element.

8. The method according to claim 1, wherein said positioning includes placing the mask in contact with the photoresist layer.

9. The method according to claim 1, wherein the generating includes forming the mask from half-toning.

10. A refractive optical element made in accordance with the method of claim 1.

* * * * *